United States Patent
Muraki et al.

(10) Patent No.: US 6,946,665 B2
(45) Date of Patent: Sep. 20, 2005

(54) CHARGED PARTICLE BEAM EXPOSURE METHOD AND APPARATUS AND DEVICE MANUFACTURING METHOD USING THE APPARATUS

(75) Inventors: Masato Muraki, Tokyo (JP); Yoshinori Nakayama, Sayama (JP); Hiroya Ohta, Kodaira (JP); Haruo Yoda, Hinode (JP); Norio Saitou, Tokorozawa (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/909,300

(22) Filed: Aug. 3, 2004

(65) Prior Publication Data

US 2005/0029473 A1 Feb. 10, 2005

(30) Foreign Application Priority Data

Aug. 6, 2003 (JP) ............................... 2003-206223

(51) Int. Cl.[7] ............................... H01J 3/07; H01J 3/14
(52) U.S. Cl. ..................... 250/492.1; 250/492.2; 250/491.1
(58) Field of Search .................. 250/492.1, 492.2, 250/491.1, 492.22

(56) References Cited

U.S. PATENT DOCUMENTS

| | | | |
|---|---|---|---|
| 5,323,499 A | 6/1994 | Chan | 5/448 |
| 5,834,783 A | 11/1998 | Muraki et al. | 250/398 |
| 5,864,142 A | 1/1999 | Muraki et al. | 250/491.1 |
| 5,905,267 A | 5/1999 | Muraki | 250/492.22 |
| 5,929,454 A | 7/1999 | Muraki et al. | 350/491.1 |
| 5,939,725 A | 8/1999 | Muraki | 250/492.22 |
| 5,973,332 A | 10/1999 | Muraki et al. | 250/492.2 |
| 5,981,954 A | 11/1999 | Muraki | 250/397 |
| 6,054,713 A | 4/2000 | Miyake et al. | 250/492.24 |
| 6,104,035 A | 8/2000 | Muraki | 250/492.22 |
| 6,107,636 A | 8/2000 | Muraki | 250/492.2 |
| 6,124,599 A | 9/2000 | Muraki | 250/492.22 |
| 6,137,113 A | 10/2000 | Muraki | 250/492.22 |
| 6,166,387 A | 12/2000 | Muraki et al. | 250/492.2 |
| 6,297,510 B1 * | 10/2001 | Farley | 250/492.21 |
| 6,392,243 B1 | 5/2002 | Muraki | 250/491.1 |
| 6,472,672 B1 | 10/2002 | Muraki | 250/492.2 |
| 6,552,353 B1 | 4/2003 | Muraki | 250/492.2 |
| 6,559,456 B1 | 5/2003 | Muraki | 250/491.1 |
| 6,559,463 B2 | 5/2003 | Ono et al. | 250/492.22 |
| 6,566,664 B2 * | 5/2003 | Muraki | 250/492.2 |
| 6,583,430 B1 | 6/2003 | Muraki | 250/492.22 |
| 6,657,210 B1 | 12/2003 | Muraki | 250/492.22 |
| 2002/0160311 A1 | 10/2002 | Muraki et al. | 430/296 |
| 2002/0179855 A1 | 12/2002 | Muraki | 250/492.22 |

FOREIGN PATENT DOCUMENTS

JP 9-330680 12/1997

* cited by examiner

Primary Examiner—Nikita Wells
(74) Attorney, Agent, or Firm—Fitzpatrick, Cella, Harper & Scinto

(57) ABSTRACT

A charged particle beam exposure apparatus which exposes a substrate using a plurality of charged particle beams includes a first measurement member for making the plurality of charged particle beams come incident and measuring a total current value of the charged particle beams. A second measurement member makes the plurality of charged particle beams come incident and multiplies electrons of each of the incident charged particle beams, thereby measuring a relative value of a current of each of the charged particle beams.

9 Claims, 7 Drawing Sheets

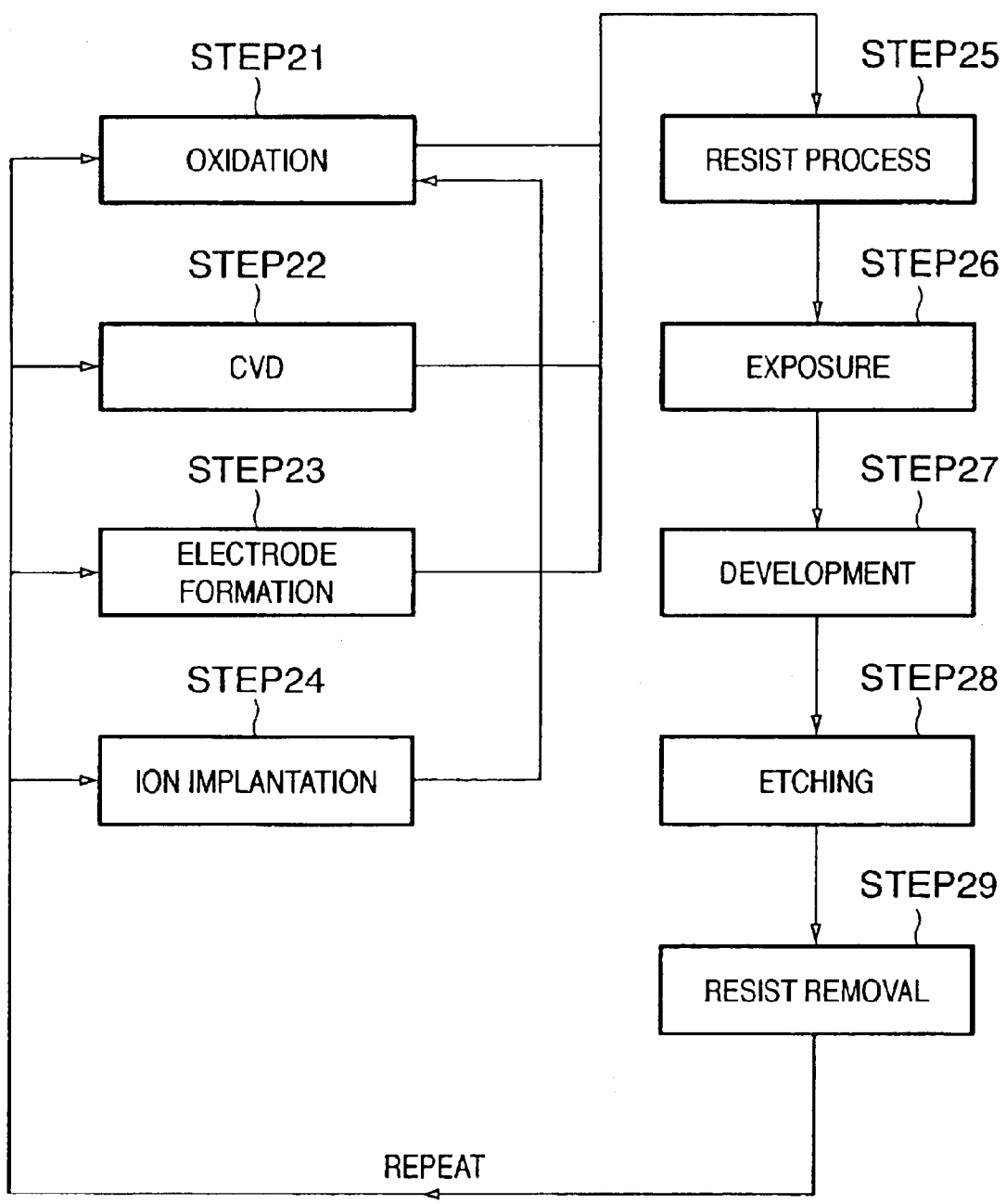

CHARGED PARTICLE BEAM EXPOSURE METHOD AND APPARATUS AND DEVICE MANUFACTURING METHOD USING THE APPARATUS

CLAIM OF PRIORITY

This application claims priority from Japanese Patent Application No. 2003-206223 filed on Aug. 6, 2003, which is hereby incorporated by reference herein.

FIELD OF THE INVENTION

The present invention relates to a charged particle beam exposure apparatus such as an electron beam exposure apparatus or ion beam exposure apparatus mainly used to expose a semiconductor integrated circuit and, more particularly, to a charged electron beam exposure apparatus which directly exposes a substrate such as a wafer using a plurality of charged particle beams.

BACKGROUND OF THE INVENTION

Electron beam exposure apparatuses include, e.g., a point beam type apparatus which uses a beam spot and a variable rectangular beam type apparatus which uses a beam having a variable size rectangular cross section.

A point beam type electron beam exposure apparatus uses a single electron beam and can perform exposure at high resolution. However, the electron beam exposure apparatus has a low throughput and thus is only used in limited applications such as research and development, exposure mask manufacture, and the like. A variable rectangular beam type electron beam exposure apparatus has a throughput which is one or two orders of magnitude higher than that of a point beam type one. Since the electron beam exposure apparatus basically uses a single electron beam for exposure, it often has a problem with the throughput in exposing a pattern comprising highly integrated fine patterns of about 0.1 mm.

To solve this problem, there is available a stencil mask type electron beam exposure apparatus. The apparatus forms a pattern for exposure in a stencil mask as pattern transmitting holes and transfers the pattern for exposure onto a sample surface through a reduction electron optical system by illuminating the stencil mask with an electron beam. There is also available a multi electron beam exposure apparatus (e.g., see Japanese Patent Laid Open No. 9 330680 (FIGS. 1 and 2)). The apparatus illuminates a substrate having a plurality of apertures with electron beams, irradiates a sample surface with a plurality of electron beams having passed through the plurality of apertures through a reduction electron optical system, and deflects the plurality of electron beams to scan the sample surface. At the same time, the apparatus exposes the sample surface to a desired pattern by individually applying/not applying the plurality of electron beams in accordance with a pattern for exposure. In both apparatuses, an area to be exposed at one time, i.e., the exposure area is larger than a conventional apparatus. Accordingly, the throughput can be increased.

In exposure using multi electron beams as described in the latter example, accurate measurement of the current value of each electron beam and uniformization of the irradiation dose for a wafer are required to expose the wafer to a desired pattern. Although the current of each beam is about 1 nA, a member for measuring each electron beam is a Faraday cup which performs direct current measurement or a unit which measures secondary electrons and reflected electrons. Thus, a dark current, or the like, may lower the S/N ratio.

SUMMARY OF THE INVENTION

The present invention has been made in consideration of the above mentioned conventional drawback, and has as its object to provide a charged particle beam exposure apparatus which can accurately measure the current of each electron beam and can perform exposure to a desired pattern with an appropriate exposure amount.

To achieve the above mentioned object, according to the present invention, there is provided a charged particle beam exposure apparatus which exposes a substrate using a plurality of charged particle beams, characterized by comprising a first measurement member for making the plurality of charged particle beams come incident and measuring a total current value of the charged particle beams and a second measurement member for making the charged particle beams come incident and multiplying electrons of the incident charged particle beams, thereby measuring a relative value of a current of each of the charged particle beams.

The charged particle beams may be divided into a plurality of groups each of which comprises ones with small intensity variations. The relative value obtained by measuring one or more charged particle beams sampled from each group may be used as the relative value of the current of each charged particle beam of the group.

The apparatus preferably further comprises a member for calculating the current value of each charged particle beam on the basis of the total current from the first measurement member and the relative value from the second measurement member.

According to the present invention, there is provided a charged particle beam exposure method of exposing a substrate using a plurality of charged particle beams, characterized by comprising a first step of making the plurality of charged particle beams come incident on first measurement means which can detect an absolute value of a current derived from incident electrons and measuring a total current of the charged particle beams, a second step of making the plurality of charged particle beams come incident on second measurement means which has an electron multiplying function and measuring a relative value of a current of each of the plurality of charged particle beams, a third step of calculating an absolute value of the current of each charged particle beam on the basis of the total current measured in the first step and the relative value measured in the second step, and a fourth step of controlling an exposure amount with each charged particle beam on the basis of the calculated absolute value. Control of the exposure amount by each charged particle beam is performed by controlling, e.g., the scan velocity in scanning, a period of time when an electron beam is applied to each exposure point (pixel), and a voltage for heating an electron gun which generates electron beams.

As the first measurement member or means, a detector such as a Faraday cup which has low sensitivity but can detect an absolute current value is used. As the second measurement member or means, a detector such as a PIN photo diode, an avalanche diode, or a MCP (Micro Channel Plate), which has an electron multiplying function and high sensitivity is used. The detector preferably comprises a multi detector in which a plurality of sensing elements are arrayed on a single plane so as to correspond to the plurality of charged particle beams in a one to one relationship. In this case, each sensing element can measure the relative value of the current of one corresponding charged particle beam. Variations in sensitivity between the sensing elements are preferably measured to correct measurement values. Sensitivity measurement may be performed by sequentially making an arbitrary charged particle beam come incident on the corresponding sensing element. To increase the throughput, a plurality of ones of the sensing elements preferably perform measurement using a plurality of charged particle beams at the center having small intensity variations.

The charged particle beam exposure apparatus and method can preferably be used to manufacture in particular a microdevice (e.g., a semiconductor chip such as an IC or LSI, a liquid crystal panel, a CCD, a thin film magnetic head, a micromachine, or the like).

According to the present invention, by calculating the current value of each charged particle beam on the basis of the total current measured by the first measurement member or means and the relative value measured by the second measurement member or means, a problem of low S/N ratio caused by a dark current, or the like, can be solved, and accurate measurement of the current of each charged particle beam is allowed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a flowchart for explaining the wafer process in FIG. 6.

DETAILED DESCRIPTION OF THE PREFERRED EMBODIMENT

As an example of a charged particle beam exposure apparatus, this embodiment will illustrate an electron beam exposure apparatus. Note that this embodiment can be applied to not only exposure apparatuses using electron beams but also ones using ion beams.

<Explanation of Components of Electron Beam Exposure Apparatus>

Figure 1:
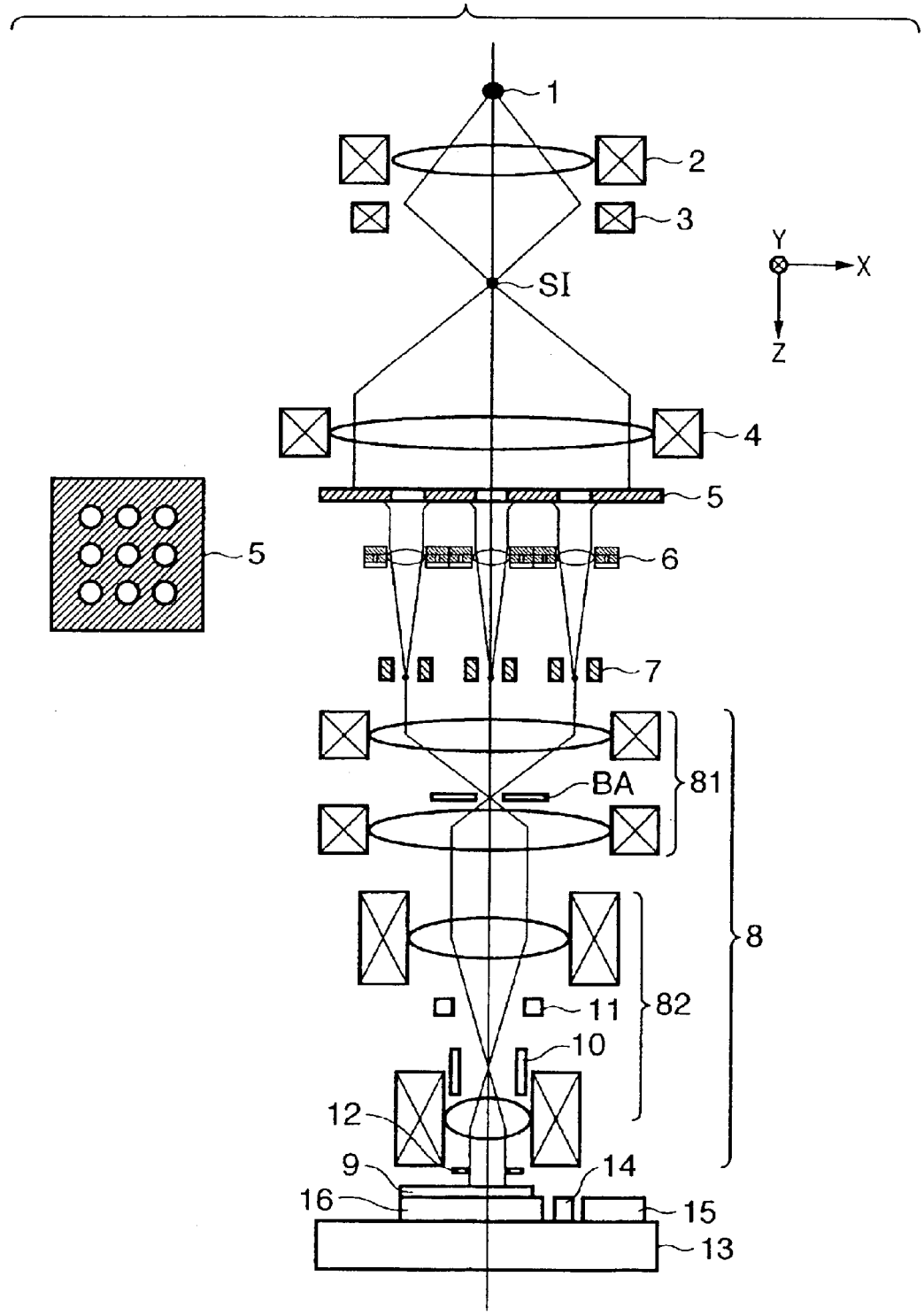
FIG. 1 is a view schematically showing the main part of an electron exposure apparatus according to a preferred embodiment of the present invention.

FIG. 1 is a view schematically showing the main part of an electron beam exposure apparatus according to a preferred embodiment of the present invention. In FIG. 1, an electron beam generated by an electron gun (not shown) forms a crossover image 1 (to be referred to as an electron source 1 hereinafter).

An electron beam emitted from the electron source 1 passes through a beam shaping optical system 2 and forms an image SI of the electron source 1. A first stigmator 3 serving as a magnetic octupole stigmator can cause astigmatism in the image SI. The first stigmator 3 is provided to correct any electrostatic astigmatism caused by an apparatus assembly error such as lens decentering. The electron beam from the image SI becomes almost parallel through a collimator lens 4. An aperture array 5 having a plurality of apertures is irradiated with the almost parallel electron beam. The first stigmator 3 may be provided at any position between the electron source 1 and the aperture array 5. A plurality of electron sources 1 may be provided.

The aperture array 5 has the plurality of apertures. The almost parallel electron beam passes through the apertures and is divided into a plurality of electron beams. The plurality of electron beams derived from the aperture array 5 form intermediate images of the image SI through an electrostatic lens array 6 having a plurality of electrostatic lenses. A blanker array 7 which has a plurality of blankers is arranged on the plane of the intermediate images.

A reduction electron optical system 8 comprising two symmetric magnetic doublet lenses 81 and 82 is provided downstream of the intermediate image plane. The plurality of intermediate images are projected onto a wafer 9. At this time, electron beams deflected by the blanker array 7 are shielded by a blanking aperture BA and thus do not come incident on the wafer 9. On the other hand, electron beams not deflected by the blanker array 7 are not shielded by the blanking aperture BA and thus come incident on the wafer 9. That is, the blanker array 7 individually controls to apply/not to apply the plurality of electron beams.

A deflector 10 which simultaneously displaces the plurality of electron beams in the X and Y directions to desired positions, a second stigmator 11 serving as an electrostatic octupole stigmator which simultaneously adjusts any astigmatism of the plurality of electron beams, and a focus coil 12 which simultaneously adjusts the focuses of the plurality of electron beams are arranged in the lower doublet lens 82. An X Y stage 13 bears the wafer 9 and can move in the X and Y directions perpendicular to the optical axis. An electrostatic chuck 16 for electrostatically attracting the wafer 9, a Faraday cup 14, which makes a plurality of electron beams directly come incident on it and measures the total current of the electron beams, and a multi detector 15, which has a function of making each of the plurality of electron beams directly come incident on it and multiplying incident electrons, and measures the relative value of the current of each electron beam, are arranged on the X Y stage 13.

Figure 2:
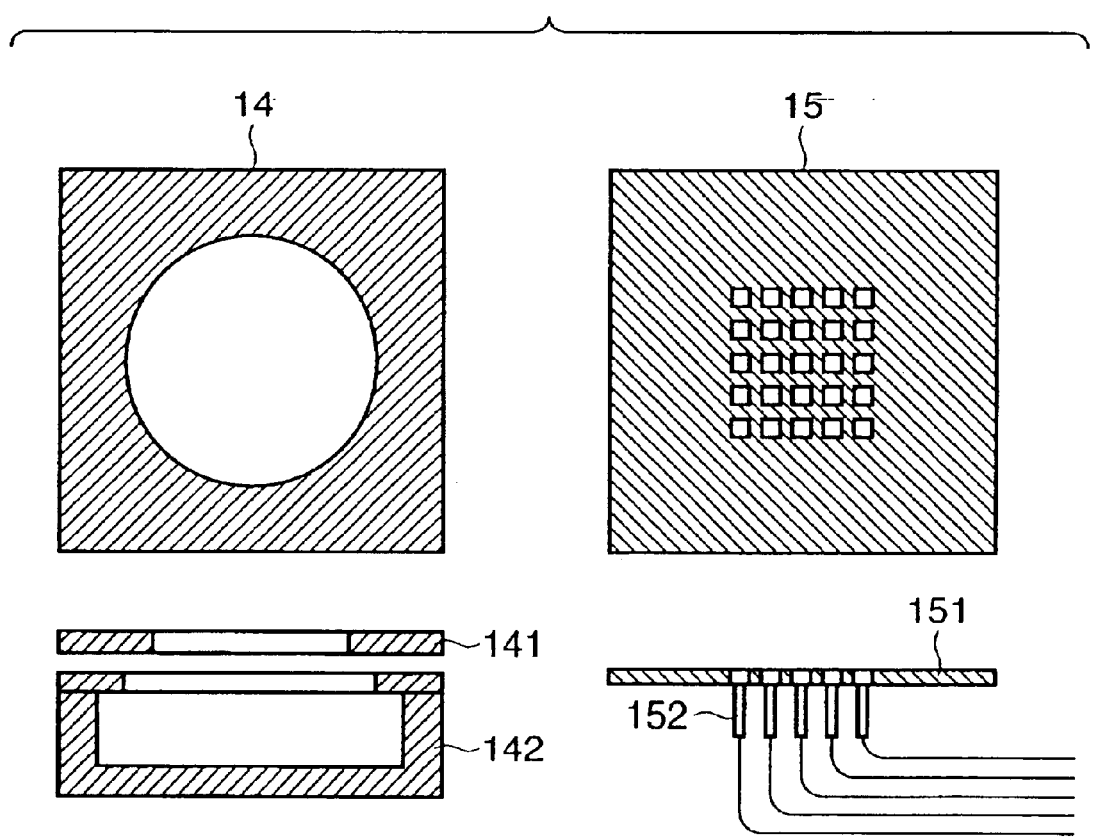
FIG. 2 is a view for explaining an absolute detector and a relative detector according to this embodiment.

FIG. 2 shows the Faraday cup 14 and multi detector 15 according to this embodiment. The Faraday cup 14 comprises a restriction aperture 141 which has an aperture large enough to collectively pass the currents of a plurality of electron beams and a detection cup 142 which can directly detect the currents of the plurality of electron beams having passed through the restriction aperture 141. The Faraday cup 14 can solve a conventional problem of low SIN ratio when individually measuring the current of each beam by measuring the total current of electron beam (EB) exposure rays.

The multi detector 15 comprises an aperture 151 in which a plurality of restriction apertures corresponding to a plurality of electron beams are formed and detectors 152, which correspond to the restriction apertures in a one to one relationship. The number of restriction apertures need not be equal to that of the electron beams and may be smaller than it. In this case, the relative current value of one beam is used as the relative value of each of a plurality of electron beams within a relatively narrow range where the current can be considered to be the same. The plurality of electron beams within the range may be made to come incident on one detector, and a value obtained by measuring the plurality of electron beams or a value obtained by dividing the measurement value by the number of electron beams may be used as the relative value of each electron beam within the range. Each detector 152 has a function of multiplying directly incident electrons. As the detector 152, for example, a PIN photo diode, an avalanche photo diode, or an MCP (Micro Channel Plate) can be used. Alternatively, a scintillator which converts electrons into light may be used. In this case, obtained light may be extracted outside a vacuum through an optical fiber and may be converted into an electrical signal. The scintillator has a kind of function of multiplying electrons.

<Explanation of System Configuration and Exposure Method>

Figure 3:
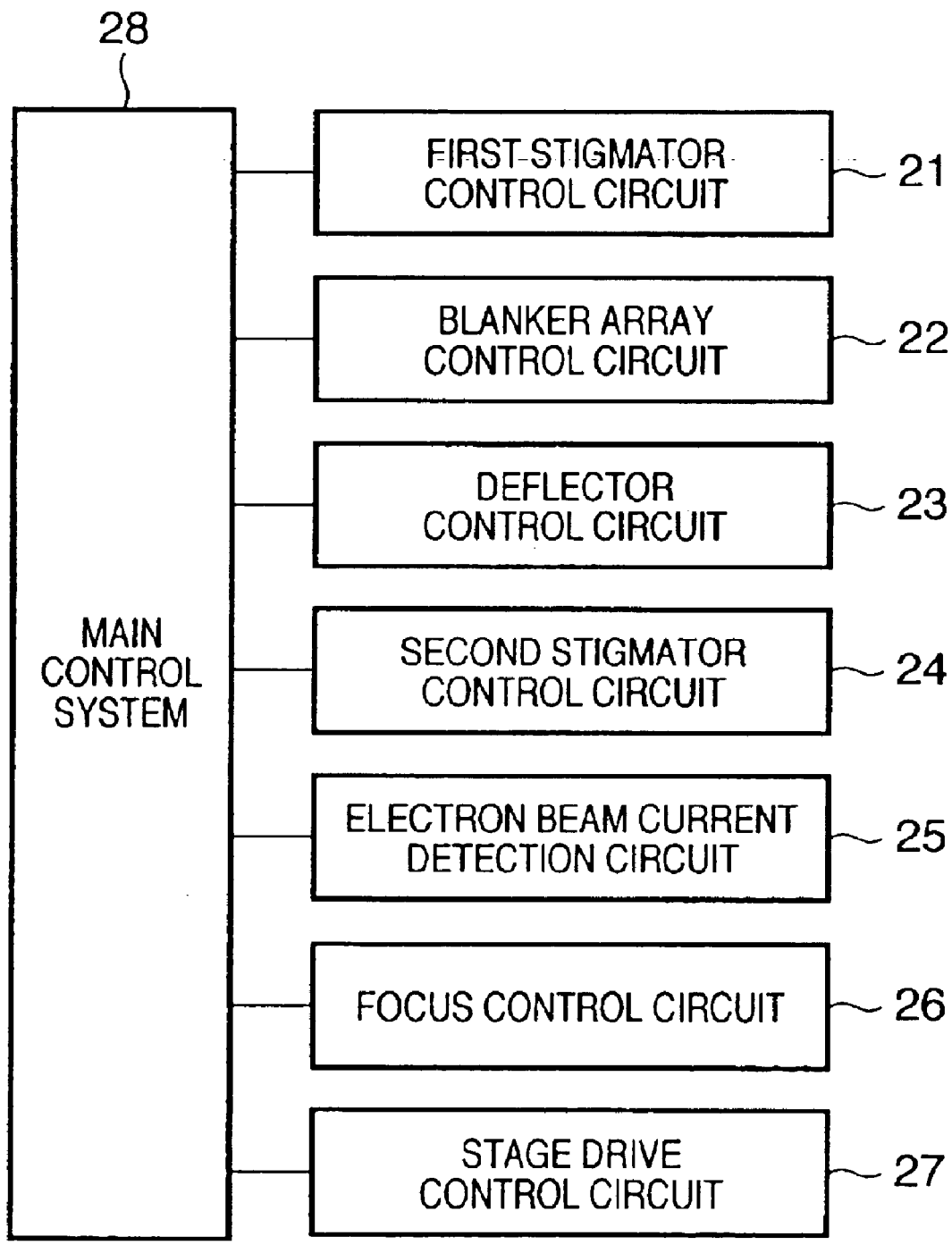
FIG. 3 is a diagram for explaining a system according to this embodiment.

FIG. 3 is a diagram of the configuration of a system according to this embodiment. A first stigmator control circuit 21 is a control circuit which controls astigmatism of the electron source image SI by adjusting a difference in focal length in a direction perpendicular to the first stigmator 3. A blanker array control circuit 22 is a control circuit which individually controls the plurality of blankers of the blanker array 7. A deflector control circuit 23 is a control circuit which controls the deflector 10. A second stigmator control circuit 24 is a control circuit which controls astigmatism of the reduction electron optical system 8 by adjusting a difference in focal length in a direction perpendicular to the second stigmator 11. An electron beam shape detection circuit 25 is a detection circuit which processes signals from the Faraday cup 14 and multi detector 15. A focus control circuit 26 is a control circuit which controls the focal position of the reduction electron optical system 8 by adjusting the focal length of the focus coil 12. A stage drive control circuit 27 is a control circuit which controls to drive the stage 13 in cooperation with a laser interferometer (not shown) which detects the position of the stage. A main control system 28 controls the above mentioned plurality of control circuits and manages operation of the entire electron beam exposure apparatus.

Figure 4:
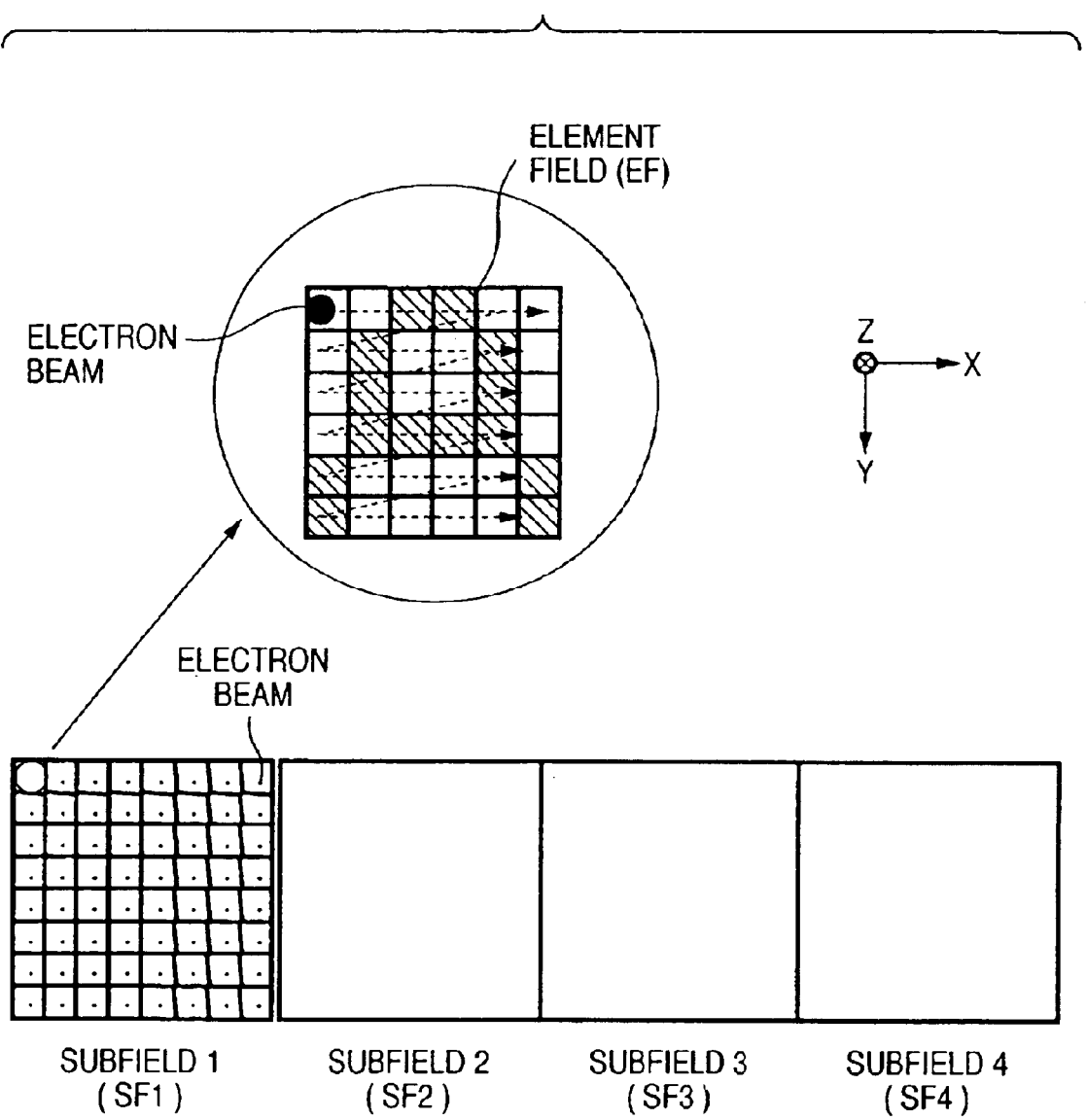
FIG. 4 is a view for explaining an exposure method according to this embodiment.

FIG. 4 is a view for explaining an exposure method according to this embodiment. The main control system 28 instructs the deflector control circuit 23 on the basis of exposure control data to make the deflector 10 deflect a plurality of electron beams. The main control system 28 also instructs the blanker array control circuit 22 to perform on off control for the blankers of the blanker array 7 in accordance with the pattern to which the wafer 9 should be exposed (drawn). Each electron beam performs scanning exposure for an element field (EF) serving as a corresponding exposure region on the wafer 9, as shown in FIG. 4. The element fields (EF) of respective electron beams are two dimensionally juxtaposed to each other, and a subfield (SF) comprising a plurality of element fields (EF) to be simultaneously exposed is exposed. For example, to perform exposure to a pattern of a character "A", as shown in FIG. 4, an exposure region is divided into a plurality of pixels. While the deflector 10 moves an electron beam to perform scanning in the X direction, the blanker performs control such that each pixel constituting part of the pattern (gray portion) is irradiated with the electron beam and each of the remaining pixels shields the electron beam. For example, the number of electron beams is 32×32=1,024. Each electron beam exposes an element field (EF) of about 2 μm square.

The diameter of one electron beam on the wafer is about 60 nm. That is, 1,024 (=32×32) element fields constitute one subfield (SF). The size of one subfield (SF) is about 64 mm square.

After the main control system 28 exposes one subfield (SF1), it instructs the deflector control circuit 23 to make the deflector 10 deflect a plurality of electron beams in order to expose the next subfield (SF2). At this time, a change in subfield due to the deflection causes a change in aberration generated when each electron beam is reduced and projected through the reduction electron optical system 8. The second stigmator control circuit 24 performs correction in accordance with instructions from the main control system 28 such that the aberration becomes constant. When a group of about 2 mm square subfields each comprising a group of 1,024 (=32×32) about 64 mm square subfields are exposed, the X Y stage is moved by about 2 mm to expose the next subfield group consisting of 1,024 subfields.

Although not shown, the deflector 10 comprises a main deflector used when the deflection width is large, and a sub deflector used when the deflection width is small. The main deflector is a magnetic deflector while the sub deflector is an electrostatic deflector. The electrostatic sub deflector scans the element fields while the magnetic main deflector switches between subfields.

<Explanation of Operation>

Figure 5:
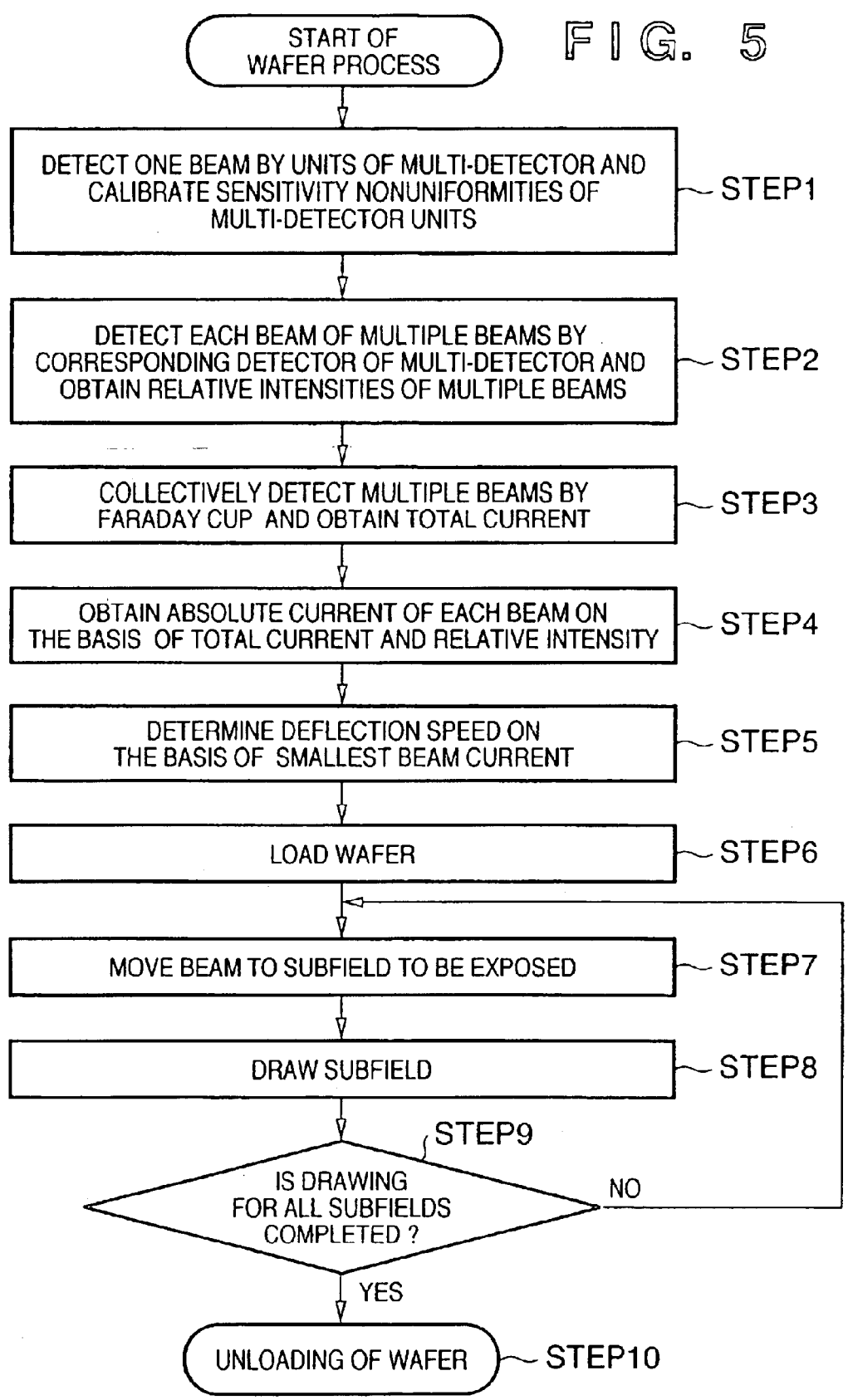
FIG. 5 is a flowchart for explaining exposure operation according to this embodiment.

Operation of the electron beam exposure apparatus of this embodiment will be described with reference to FIG. 5. For the wafer process of the exposure apparatus, the main control system 28 performs the following steps.

(Step 1) The main control system 28 shown in FIG. 3 controls the blanker array control circuit 22 (see FIG. 3) such that only central beams almost at the center of a plurality of electron beams having passed through the aperture array 5 (see FIG. 1) are applied. The central electron beams are sequentially made to come incident on the detectors 152 of the multi detector 15 (FIGS. 1 and 2), thereby measuring the currents. Only the central beams are applied because they have small variations in exposure amount. With this measurement, the sensitivity nonuniformity (s(n), n: beam number) of each detector is obtained. Assume that 1,024 detectors 152 corresponding in number to electron beams are provided, and the sensitivity nonuniformities of 64 detectors 152 are obtained at one time using 64 (=8×8) central beams. By sequentially moving the 64 central beams 16 times, the sensitivity nonuniformities of 1,024 (=64×16) detectors 152 can be obtained. The sensitivity nonuniformity (s(n)) can be defined as:

$$S(n)=V(n)/V(1)$$

where V(n) (n: beam number) is the detection result from each detector.

(Step 2) The main control system 28 applies the plurality of electron beams having passed through the aperture array 5 and makes each electron beam come incident on the corresponding detector 152 of the multi detector 15. The detectors 152 simultaneously obtain measurement values k(n) of the currents of all the electron beams. The relative intensities (k(n)/s(n)) of the plurality of electron beams are obtained on the basis of the measurement values k(n) and the sensitivity nonuniformities s(n) of the detectors obtained in Step 1.

(Step 3) The Faraday cup 14 collectively detects the plurality of electron beams to measure the total current (I).

(Step 4) The absolute current (i(n)=I×(k(n)/s(n))/(Sk(n)/s(n))) of each electron beam is calculated on the basis of the total current (I) and the relative intensity (k(n)/s(n)) of each of the plurality of electron beams.

(Step 5) The deflection speed when scanning an element field (EF) is determined from the absolute current and resist sensitivity of the smallest electron beam.

(Step 6) The wafer 9 is loaded onto the stage 13.

(Step 7) The main control system 28 deflects the plurality of electron beams to a subfield to be exposed using the deflector control circuit 23.

(Step 8) The subfield to be exposed is exposed.

(Step 9) After exposure of all subfields has been completed, the flow advances to Step 10; otherwise, the flow returns to Step 7.

(Step 10) The wafer 9 is unloaded from the stage 13.

In this embodiment, a period of time when an electron beam is applied (a period of time when blanking is not performed) at each pixel is controlled on the basis of the absolute current of each electron beam obtained in Step 4 such that the exposure amount using each electron beam becomes constant. This operation allows higher precision exposure. Although only one light source 1 is shown in FIG. 1, a plurality of light sources may be provided.

<Device Production Method>

Figure 6:
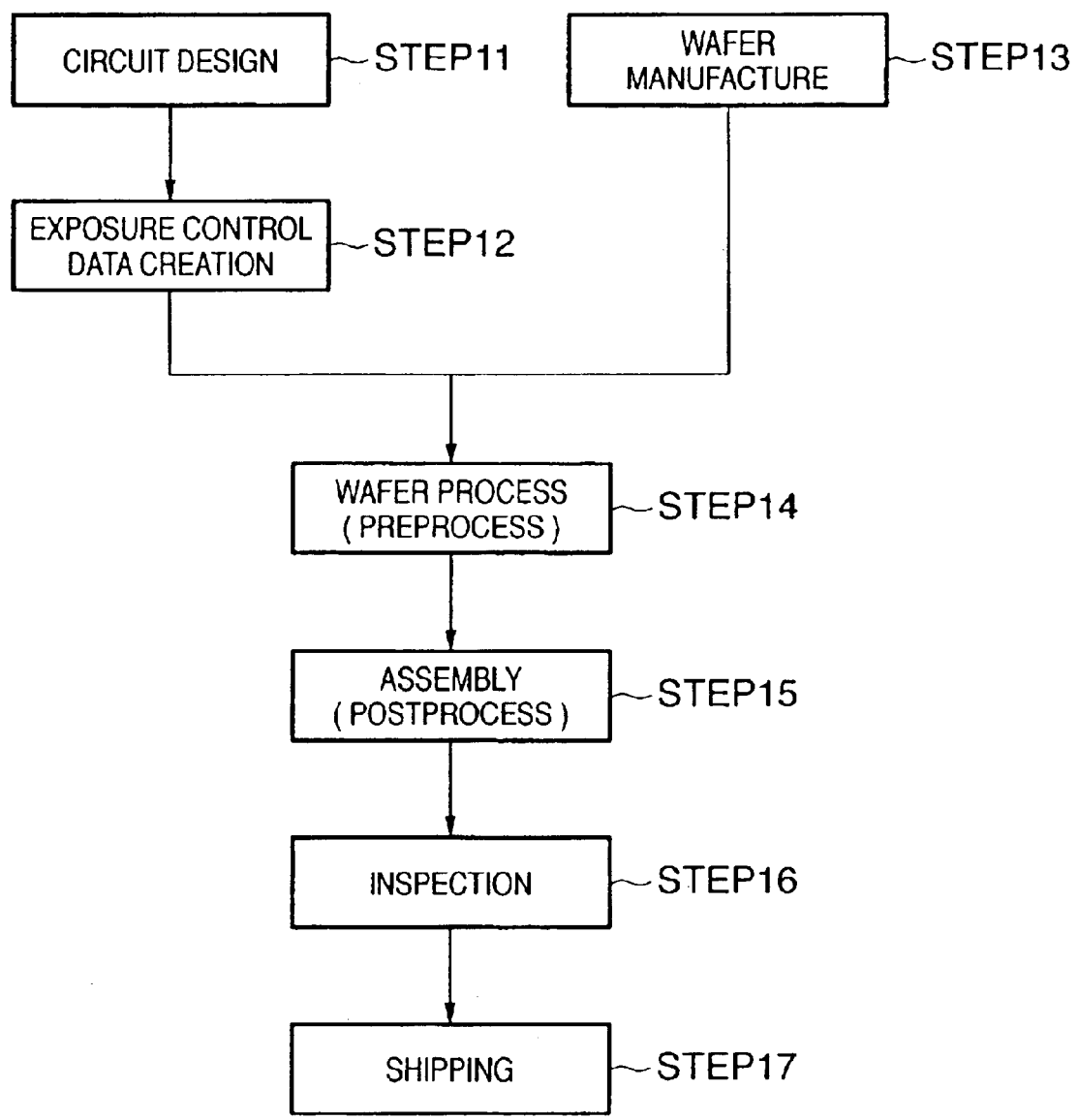
FIG. 6 is a flowchart for explaining the flow of a device manufacturing process.

An example of a device production method using the above mentioned electron beam exposure apparatus will be explained:

FIG. 6 shows the manufacturing flow of a microdevice (e.g., a semiconductor chip such as an IC or LSI, a liquid crystal panel, a CCD, a thin film magnetic head, a micromachine, or the like). In step 11 (circuit design), a semiconductor device circuit is designed. In step 12 (exposure control data creation), exposure control data for the above mentioned charged particle beam exposure apparatus is created based on the designed circuit pattern. In step 13 (wafer manufacture), a wafer is manufactured by using a material such as silicon. In step 14 (wafer process), called a preprocess, an actual circuit is formed on the wafer by lithography using the prepared wafer and the exposure apparatus, into which the exposure control data is input. Step 15 (assembly), called a postprocess, is the step of forming a semiconductor chip by using the wafer formed in step 14, and includes an assembly process (dicing and bonding) and a packaging process (chip encapsulation). In step 16 (inspection), the semiconductor device manufactured in step 15 undergoes inspections such as an operation confirmation test and a durability test of the semiconductor device manufactured in step 15. After these steps, the semiconductor device is completed and shipped (step 17).

FIG. 7 shows the detailed flow of the above mentioned wafer process. In step 21 (oxidation), the wafer surface is oxidized. In step 22 (CVD), an insulating film is formed on the wafer surface. In step 23 (electrode formation), an electrode is formed on the wafer by vapor deposition. In step 24 (ion implantation), ions are implanted in the wafer. In step 25 (resist processing), a photosensitive agent is applied to the wafer. In step 26 (exposure), the wafer is exposed to the circuit pattern using the above mentioned exposure apparatus. In step 27 (development), the exposed wafer is developed. In step 28 (etching), the resist is etched except for the developed resist image. In step 29 (resist removal), an unnecessary resist after etching is removed. These steps are repeated to form multiple circuit patterns on the wafer.

With the manufacturing method according to this embodiment, highly integrated semiconductor devices which have been difficult to manufacture by a conventional method can be manufactured at low cost.

As has been described above, according to the present invention, there can be provided a charged particle beam exposure apparatus which can accurately measure the current of each electron beam and can perform exposure to a desired pattern with an appropriate exposure amount. If the apparatus is used to manufacture devices, devices can be manufactured at a higher yield.

As many apparently widely different embodiments of the present invention can be made without departing from the spirit and scope thereof, it is to be understood that the invention is not limited to the specific embodiments thereof except as defined in the claims.

What is claimed is:

1. A charged particle beam exposure apparatus which exposes a substrate using a plurality of charged particle beams, comprising:

a first measurement member for making the plurality of charged particle beams come incident and measuring a total current value of the charged particle beams; and a second measurement member for making the plurality of charged particle beams come incident and multiplying electrons of each of the incident charged particle beams, thereby measuring a relative value of a current of each of the charged particle beams.

2. The apparatus according to claim 1, wherein said second measurement member comprises a plurality of detectors which have an electron multiplying function and correspond to the plurality of charged particle beams, and each detector measures a relative value of a current of the corresponding charged particle beam.

3. The apparatus according to claim 1, wherein said second measurement member comprises a plurality of detectors which have an electron multiplying function, the plurality of charged particle beams are divided into a plurality of charged particle beam groups to make the charged particle beam groups correspond to said detectors, and measures a relative value of a current of each charged particle beam by measuring, by each of said detectors, currents of one or more charged particle beams in the corresponding charged particle beam group.

4. The apparatus according to claim 1, further comprising a member for calculating a current value of each charged particle beam on the basis of the total current measured by said first measurement member and the relative value of the current measured by said second measurement member.

5. A device manufacturing method comprising steps of exposing a substrate using a charged particle beam exposure apparatus as defined in claim 1 and developing the exposed substrate.

6. A charged particle beam exposure method of exposing a substrate using a plurality of charged particle beams, comprising:

a first step of making the plurality of charged particle beams come incident on first measurement means which can detect an absolute value of a current derived from incident electrons and measuring a total current of the charged particle beams;

a second step of making the plurality of charged particle beams come incident on second measurement means which has an electron multiplying function and measuring a relative value of a current of each of the plurality of charged particle beams;

a third step of calculating an absolute value of the current of each charged particle beam on the basis of the total current measured in the first step and the relative value measured in the second step; and a fourth step of controlling an exposure amount with each charged particle beam on the basis of the calculated absolute value.

7. A charged particle beam exposure apparatus which exposes a substrate using a plurality of charged particle beams, comprising:

a first detector which makes a plurality of charged particle beams come incident and detects a total current value of the charged particle beams;

a second detector which makes a plurality of charged particle beams come incident and detects a current value of each of the charged particle beams; and a controller which controls an exposure amount with each charged particle beam on the basis of a detection result from said first detector and a detection result from said second detector.

8. The apparatus according to claim 7, wherein said first detector includes one Faraday cup, and said second detector includes a plurality of PIN photodiodes, avalanche diodes, or Micro Channel Plates.

9. A device manufacturing method comprising steps of exposing a substrate using a charged particle beam exposure apparatus as defined in claim 7 and developing the exposed substrate.

* * * * *